United States Patent
Han et al.

(10) Patent No.: US 8,298,887 B2
(45) Date of Patent: Oct. 30, 2012

(54) HIGH MOBILITY MONOLITHIC P-I-N DIODES

(75) Inventors: Xinhai Han, Sunnyvale, CA (US); Nagarajan Rajagopalan, Santa Clara, CA (US); Ji Ae Park, Santa Clara, CA (US); Bencherki Mebarki, Santa Clara, CA (US); Heung Lak Park, Santa Clara, CA (US); Bok Hoen Kim, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 12/824,032

(22) Filed: Jun. 25, 2010

(65) Prior Publication Data

US 2011/0136327 A1 Jun. 9, 2011

Related U.S. Application Data

(60) Provisional application No. 61/266,264, filed on Dec. 3, 2009.

(51) Int. Cl.
*H01L 21/8234* (2006.01)
(52) U.S. Cl. .................................................. 438/237
(58) Field of Classification Search .............. 438/237
See application file for complete search history.

(56) References Cited

U.S. PATENT DOCUMENTS

| 5,298,455 A | 3/1994 | Arai et al. | |
| 5,442,198 A | 8/1995 | Arai et al. | |
| 5,720,826 A * | 2/1998 | Hayashi et al. | 136/249 |
| 6,337,224 B1 * | 1/2002 | Okamoto et al. | 438/69 |

(Continued)

FOREIGN PATENT DOCUMENTS

KR 10-2008-0074883 A 8/2008

OTHER PUBLICATIONS

Sasago et al., "Cross-point phase change memory with $4F^2$ cell size driven by low-contact-resistivity poly-Si diode," 2009 Symposium on VLSI Technology Digest of Technical Papers; pp. 24-25; downloaded on Oct. 5, 2009 from IEEE Xplore.

(Continued)

*Primary Examiner* — Charles Garber
*Assistant Examiner* — Andre' C Stevenson
(74) *Attorney, Agent, or Firm* — Kilpatrick Townsend & Stockton LLP

(57) ABSTRACT

Methods of forming high-current density vertical p-i-n diodes on a substrate are described. The methods include the steps of concurrently combining a group-IV-element-containing precursor with a sequential exposure to an n-type dopant precursor and a p-type dopant precursor in either order. An intrinsic layer is deposited between the n-type and p-type layers by reducing or eliminating the flow of the dopant precursors while flowing the group-IV-element-containing precursor. The substrate may reside in the same processing chamber during the deposition of each of the n-type layer, intrinsic layer and p-type layer and the substrate is not exposed to atmosphere between the depositions of adjacent layers.

18 Claims, 5 Drawing Sheets

U.S. PATENT DOCUMENTS

| | | | |
|---|---|---|---|
| 6,351,023 B1 * | 2/2002 | Gates et al. | 257/623 |
| 7,285,464 B2 | 10/2007 | Herner et al. | |
| 7,514,762 B2 | 4/2009 | Deane | |
| 7,535,074 B2 | 5/2009 | Einbrodt et al. | |
| 7,586,773 B2 | 9/2009 | Herner | |
| 7,615,502 B2 | 11/2009 | Gu | |
| 7,941,004 B2 * | 5/2011 | Zhu et al. | 382/299 |
| 2002/0022349 A1 | 2/2002 | Sugiyama et al. | |
| 2007/0243338 A1 | 10/2007 | Aslami et al. | |

OTHER PUBLICATIONS

Notification of Transmittal of the International Search Report and the Written Opinion of the International Searching Authority, or the Declaration; International Search Report and Written Opinion of the International Searching Authority for corresponding International Application No. PCT/US2010/057670 dated Aug. 9, 2011, 10 pages.

* cited by examiner

HIGH MOBILITY MONOLITHIC P-I-N DIODES

CROSS-REFERENCES TO RELATED APPLICATIONS

This application claims the benefit of U.S. Prov. Pat. App. No. 61/266,264 filed Dec. 3, 2009, and titled "HIGH MOBILITY MONOLITHIC P-I-N DIODES," which is incorporated herein by reference for all purposes.

BACKGROUND OF THE INVENTION

P-i-n diodes are useful for high-speed and/or high-power applications while also increasing the capture rate in detection applications. These structures have been incorporated in static memory modules where the diodes are monolithically integrated into memory cells.

Horizontally-oriented p-i-n diodes have been made in a manner similar to CMOS transistors by sequentially doping a device through ion implantation using a sequence of masks which only expose the portion of the substrate which requires p- or n-type dopant. The high density of memory devices necessitates the production of vertical p-i-n diodes which have been formed by depositing a thick intrinsic layer and sequentially bombarding the stack with e.g. low energy p-type dopant and high energy n-type dopant to position the dopants as desired in a p-i-n stack. Subsequent processing, such as laser annealing, is needed to "heal" or increase grain size in the p-i-n diode stack which raises the mobility and allows higher current densities to be achieved. The high temperature anneals redistribute the dopants which can compromise the performance of devices created.

Thus, there is a need for new deposition processes to form p-i-n diode stacks which offer high mobility (i.e. can tolerate high current densities) and still allow the dopant profile to be precisely controlled. This and other needs are addressed in the present application.

BRIEF SUMMARY OF THE INVENTION

Methods of forming high-current density vertical p-i-n diodes on a substrate are described. The methods include the steps of concurrently combining a group-IV-element-containing precursor with a sequential exposure to an n-type dopant precursor and a p-type dopant precursor in either order. An intrinsic layer is deposited between the n-type and p-type layers by reducing or eliminating the flow of the dopant precursors while flowing the group-IV-element-containing precursor. The substrate may reside in the same processing chamber during the deposition of each of the n-type layer, intrinsic layer and p-type layer and the substrate is not exposed to atmosphere between the depositions of adjacent layers.

In one embodiment, the present disclosure provides a method of forming a high-current density vertical p-i-n diode on a substrate in a substrate processing region in a substrate processing chamber. The method includes transferring the substrate into the substrate processing region, flowing a group-IV-element-containing precursor having a group-IV flow rate while also flowing hydrogen with a hydrogen flow rate into the substrate processing region to form a polycrystalline semiconducting film on the substrate and forming an RF plasma in the substrate processing region. The method further includes doping the semiconducting film during formation to form a vertical p-i-n film stack by sequentially (1) supplying a first dopant-containing precursor at a first dopant flow rate during formation of a first doped layer, (2) supplying essentially no flow rate of dopant-containing precursor during formation of an intrinsic layer and (3) supplying a second dopant-containing precursor at a second dopant flow rate during formation of a second doped layer. The formation of the first doped layer, the intrinsic layer and the second doped layer occur without exposing the substrate to atmosphere between formation of adjacent layers. The oxygen incorporation near the interface is reduced and electronic mobility is improved and the first doped layer or the second doped layer is an n-type layer and the other is a p-type layer. The method further includes removing the substrate from the substrate processing region.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Methods of forming high-current density vertical p-i-n diodes on a substrate are described. The methods include the steps of concurrently combining a group-IV-element-containing precursor with a sequential exposure to an n-type dopant precursor and a p-type dopant precursor in either order. An intrinsic layer is deposited between the n-type and p-type layers by reducing or eliminating the flow of the dopant precursors while flowing the group-IV-element-containing precursor. The substrate may reside in the same processing chamber during the deposition of each of the n-type layer, intrinsic layer and p-type layer and the substrate is not exposed to atmosphere between the depositions of adjacent layers.

The methods presented herein allow a p-i-n diode stack to be formed without the use of ion implantation which would necessitate a high temperature anneal to activate the implanted dopants. The p-i-n diode stack is also formed without exposing the substrate to the atmosphere during the deposition, thereby avoiding formation of a thin oxide layer within the stack. The thin oxide layer may reduce the electronic mobility of the device and lower the maximum tolerated current density. The maximum tolerated current density is the highest current density which does not rapidly degrade the performance by e.g. redistributing the dopants.

Exemplary P-I-N Diode Formation Process

Figure 1:
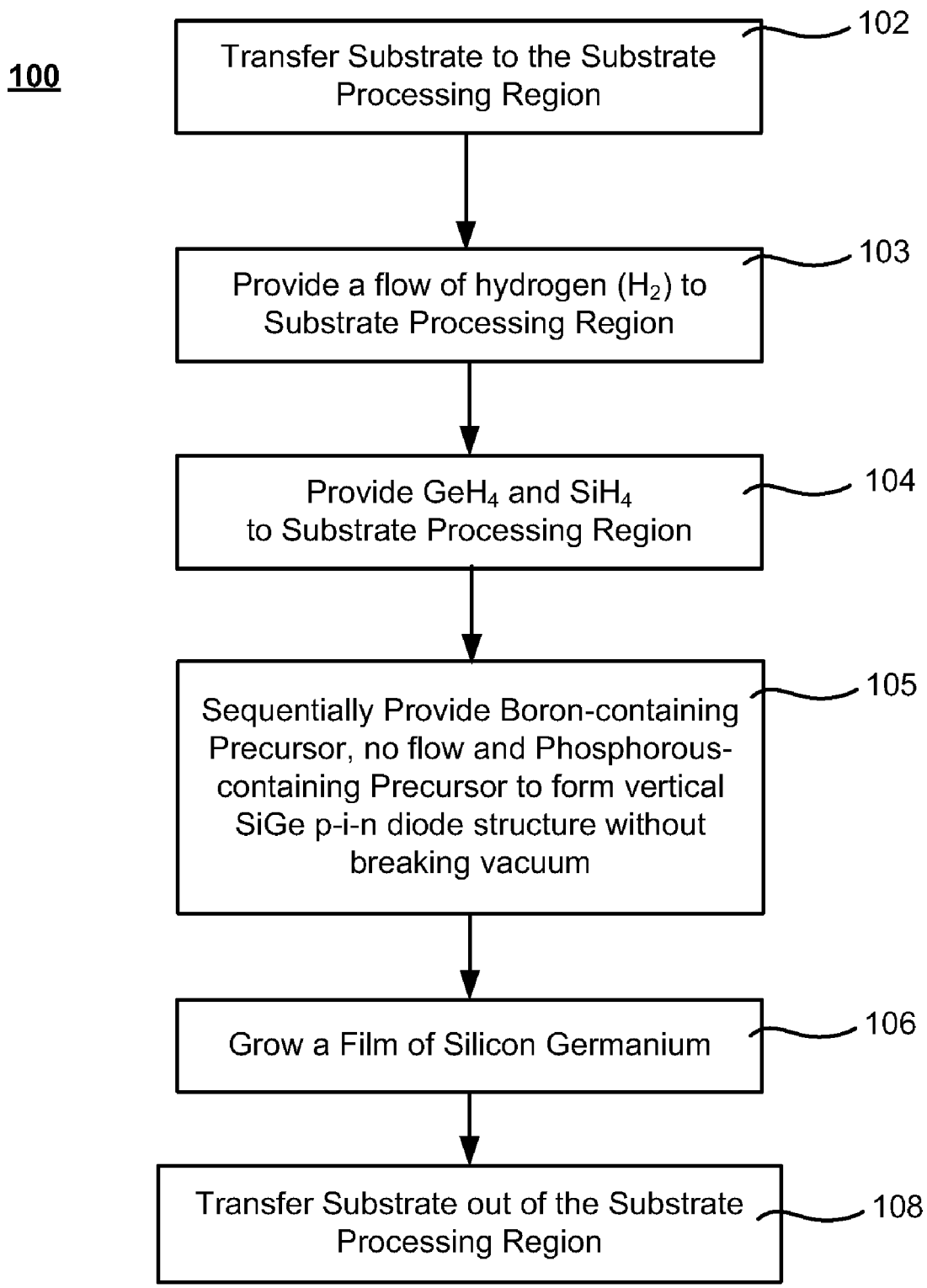
FIG. 1 is a flowchart illustrating selected steps for making a p-i-n diode stack according to embodiments of the invention.

FIG. 1 is a flowchart showing selected operations in methods 100 of making a p-i-n diode film stack according to embodiments of the invention. The method 100 includes transferring a substrate into a substrate processing region 102. A flow of hydrogen is initiated and continues 103 while flows of $GeH_4$ and $SiH_4$ are delivered to the substrate processing region 104. An RF plasma is present in the substrate processing region during the growth of the film stack. A sequence of dopant precursors are delivered in operation 105 as a film of silicon germanium is grown. In the exemplary sequence 105, a boron-containing precursor is flowed first (e.g. TEB, TMB, $BH_3$, $B_2H_6$, higher order boranes, . . . ) followed by a period of no (or low) flow and then a flow of a phosphorus-containing precursor (e.g. $PH_3$ . . . ). This sequence results in a p-i-n diode stack with the p-type layer underneath the intrinsic layer which, in turn, is below the n-type layer. Both the p-i interface and the i-n interface are subsurface and protected at this point and the substrate may be transferred from the substrate processing region 108.

Intrinsic layers at the beginning or end of the sequence should be avoided to form a p-i-n rather than undesirable i-p-i-n or p-i-n-i structures. Such structures are avoided in a number of ways. The dopant precursor may be initiated at the same time as the flows of $GeH_4$ and $SiH_4$. Alternatively, $GeH_4$ and $SiH_4$ flows may be initiated and allowed to establish a steady flow. A flow of dopant precursor may then be started before or about the same time as the plasma power to the substrate processing region is turned on. Similarly, in order to avoid an intrinsic region at the end of the sequence, the plasma power may be stopped and the flows of dopant precursor, $GeH_4$ and $SiH_4$ may be stopped simultaneous with the termination of the plasma power. The flows may also be stopped after the termination of the plasma power and even at different times for each flow. These sequences for restricting an intrinsic layer to reside predominantly between the doped layers may also be applied to the other methods presented herein, in embodiments.

Flows of $GeH_4$ and $SiH_4$ are both continued throughout the growth of the film of silicon germanium in FIG. 1. In other embodiments the flows of either or both of $GeH_4$ and $SiH_4$ are interrupted between the first doped layer and the intrinsic layer or between the intrinsic layer and the second doped layer. The presence of hydrogen during the formation of the silicon germanium ensures the film is polycrystalline. Higher flows of hydrogen will typically result in larger crystal domains within the polycrystalline film which increases the electronic mobility and helps p-i-n diodes to tolerate higher current densities. The flow rate of hydrogen is greater than the sum of the flow rates of $GeH_4$ and $SiH_4$ by a factor of greater than or about 15, greater than or about 20, greater than or about 25 or greater than or about 30 in different embodiments. The deposited film may be amorphous without the accompanying flow of hydrogen.

Variations on this sequence are clearly possible. The sequence may begin with the phosphorus-containing precursor and conclude with the boron-containing precursor which would result in a p-i-n diode stack having the n-type layer below the intrinsic layer and the p-type layer would be the outermost layer. Germanium may be supplied from other precursors such as digermane ($Ge_2H_6$) or higher order germanes. Similarly, silicon may be supplied from other precursors such as disilane ($Si_2H_6$) and higher-order silanes. The silane and germane-based precursors may also be replaced by halogen substituted alternatives having some or all the hydrogens replaced by a halogen.

The p-type dopant and the n-type dopant may be different than those used in the example of FIG. 1. Gallium may be used instead of boron to create the p-type layer and arsenic or antimony may be used in place of the phosphorus. Combinations of dopants of the same type may also be used in embodiments. Suitable precursors for delivering gallium to the substrate processing region include triethyl gallium (TEG) and trimethyl gallium (TMG). The most common dopant for arsenic is arsine ($AsH_3$) and exemplary dopants for antimony include Stibine ($SbH_3$), triethyl antimony (TESb) and trimethyl antimony (TMSb). Dopant-containing precursors may include halogen-substituted versions of all the precursors listed where a halogen (F, Cl, Br . . . ) replace some or all the hydrogens present in the dopant-containing precursors described above.

The temperature of the substrate may be between about 150° C. and about 600° C., between about 200° C. and about 500° C. or between about 300° C. and about 400° C. in different embodiments. Higher temperatures will typically result in larger mobilities since the crystal size in the polycrystalline silicon germanium increases with increased temperature. The pressure in the substrate processing region may be between about 0.5 Torr and about 10 Torr, between about 2 Torr and about 8 Torr or between about 4 Torr and about 6 Torr in different embodiments. The spacing between the top surface of the substrate and the bottom surface of the blocker plate assembly (described in detail later) in combination with the plasma power level determine the plasma power density used to excite the precursors. RF plasma frequencies may be one or a combination of RF frequencies (e.g. 350 kHz and/or 13.5 MHz) and are largely determined by communication interference considerations. Other frequencies are possible especially in regions where the other frequencies do not interfere with local frequencies allocated for communication. When 13.56 MHz is used to excite the plasma, the RF power may be between about 25 Watts and about 400 Watts, between about 50 Watts and about 350 Watts, between about 100 Watts and about 300 Watts or between about 150 Watts and about 250 Watts in different embodiments.

The combined flow rate of the silane ($SiH_4$) and germane ($GeH_4$) may be between about 20 sccm and about 200 sccm, between about 50 sccm and about 150 sccm or between about 75 sccm and about 125 sccm in different embodiments. As mentioned previously, the flow rate of the hydrogen is preferably chosen to be above or about a high multiple (e.g. 10, 20, 30, 40 . . . ) of the combined flow rate of silane and germane. In absolute terms, the hydrogen flow rate may be between about 500 sccm and about 10,000 sccm, between about 1,000 sccm and about 8,000 sccm, between about 2,000 sccm and about 7,000 sccm or between about 4,000 sccm and about 6,000 sccm in different embodiments. Helium may also be added to the substrate processing region during formation of the p-i-n diode in order to improve the uniformity of the deposition across the substrate surface. The helium flow rate may be between about 1,000 sccm and about 10,000 sccm, between about 2,000 sccm and about 9,000 sccm, between about 3,000 sccm and about 8,000 sccm or between about 4,000 sccm and about 6,000 sccm in different embodiments. All flow rates and plasma powers provided herein correspond to a dual chamber which processes one side of two circular substrates having 300 mm diameters. Appropriate scaling is required for processes used to deposit p-i-n film stacks on substrate(s) whose processed surface area differs from these.

Figure 2:
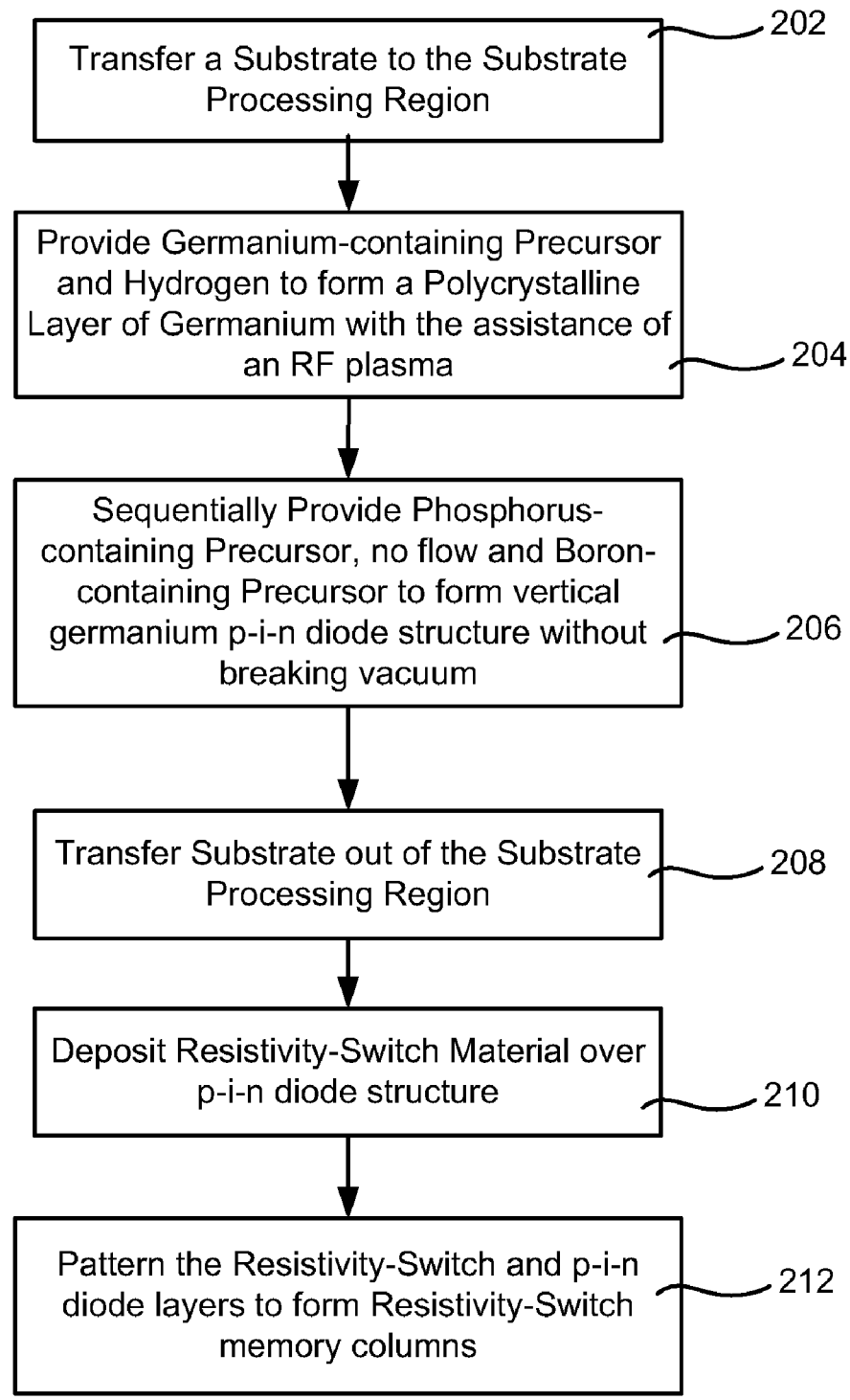
FIG. 2 is another flowchart illustrating selected steps for forming a p-i-n diode based memory device according to embodiments of the invention.

Referring now to FIG. 2, another flowchart is shown illustrating selected steps in methods 200 for forming a p-i-n diode structures as applied to resistivity switch devices. The method 200 includes transferring a substrate into a substrate processing region (operation 202) and providing germane (GeH$_4$) and hydrogen (H$_2$) to form a polycrystalline layer of germanium with the assistance of an RF plasma (operation 204). Flow rates, alternative germanium precursors, and RF plasma powers may be as they were described with reference to FIG. 1. In this example, no silicon-containing precursor is used in order to grow a germanium layer rather than a silicon-germanium layer. Germanium (Ge) provides the highest mobility and therefore results in devices which tolerate the highest current densities during operation. Silicon germanium (Si$_x$Ge$_{1-x}$) offer a continuum of mobilities which increase more or less monotonically as the proportion of germanium is increased. Though not shown in FIG. 2, a silicon precursor may be flowed into the substrate processing region as well, in disclosed embodiments, to achieve the more general composition Si$_x$Ge$_{1-x}$.

As the film of germanium is grown, a sequence of dopant precursors are delivered in operation 206. The doping operation 206 includes flowing a phosphorus-containing precursor followed by no (or low) dopant flow followed by flowing a boron-containing precursor without breaking vacuum and exposing the substrate to the atmosphere at any point during the deposition. The sequence forms a p-i-n diode film stack having n-type material on the bottom and p-type material on the top (the outermost layer). Again, an intrinsic layer lies between the n-type and the p-type material. Intrinsic layers may not be devoid of dopants and there may be some concentration of active dopants in the intrinsic layer regardless of whether no flow or a reduced flow of dopants enters the substrate processing region during the formation of the p-i-n diode film stack. The dopant concentration of the intrinsic layer may be below or about 10$^{16}$/cm$^3$, below or about 10$^{17}$/cm$^3$ or below or about 10$^{18}$/cm$^3$ in different embodiments (as with FIG. 1). Doping the film stack during deposition avoids the need to use ion implantation and enables the production of intrinsic layers with reduced dopant concentrations.

Following formation of the p-i-n diode film stack, the substrate is removed from the substrate processing region 208. The mobility of the p-i-n diode film stacks grown as described herein may be greater than or about one of 20 cm$^2$/V-sec, 50 cm$^2$/V-sec, 100 cm$^2$/V-sec or 200 cm$^2$/V-sec. The substrate is transferred to another deposition chamber where a resistivity switch material is deposited on the p-i-n diode film stack 210. Incorporation of the p-i-n diode film stack into a memory device based on resistivity switch phenomenon is an exemplary application and many other applications will benefit from high mobility p-i-n diodes. The new film stack is patterned to form resistivity-switch memory columns 212. Applications which benefit from high density may require p-i-n diode columns of lateral dimension less than or about 60 nm, less than or about 50 nm, less than or about 40 nm, less than or about 30 nm or less than or about 20 nm in different embodiments.

Figure 3:
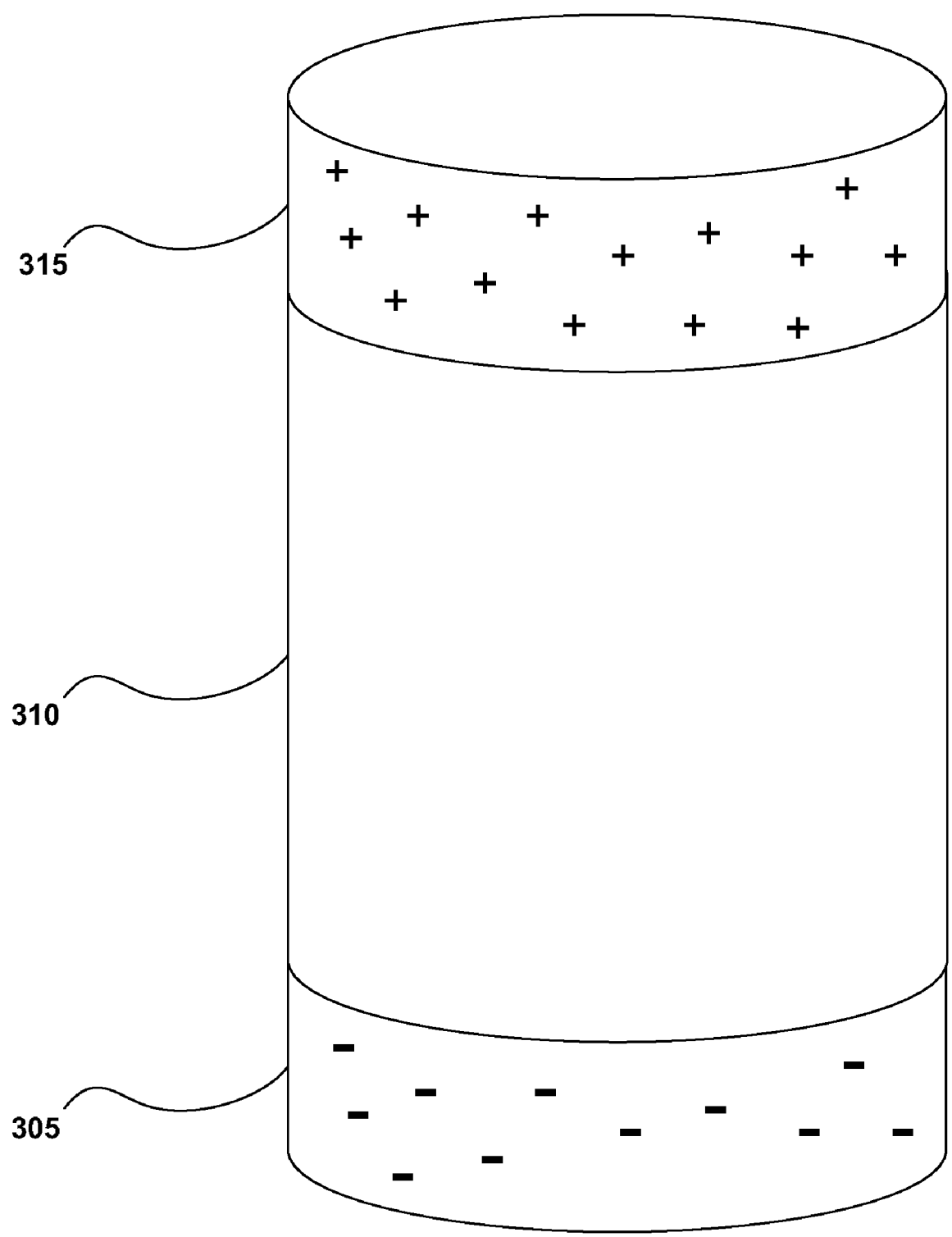
FIG. 3 is a perspective view of a columnar p-i-n diode according to embodiments of the invention.

The resulting p-i-n diode column is depicted in FIG. 3. The n-type material 305 is shown at the bottom of the column and the substrate extends below the column. The intrinsic portion 310 and the p-type portion 315 of the column are also shown. Columns having 30 nm width formed according to embodiments of the invention may tolerate currents of about 1 μA or more in the forward-biased direction. The ability to tolerate high currents allows resistivity switch material to be switched from a low-resistivity state to a high-resistivity state and to return the switch back to the low-resistivity state. Columns made according to disclosed embodiments enable even the latter transition to proceed for narrow high-density devices.

Exemplary Silicon Oxide Deposition System

Deposition chambers that may implement embodiments of the present invention may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples of CVD systems that may implement embodiments of the invention include the CENTURA ULTIMA® HDP-CVD chambers/systems, and PRODUCER® PECVD chambers/systems, available from Applied Materials, Inc. of Santa Clara, Calif.

Examples of substrate processing chambers that can be used with exemplary methods of the invention may include those shown and described in co-assigned U.S. Patent Publication No. 2007/0289534 to Lubomirsky et al, titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Figure 4:
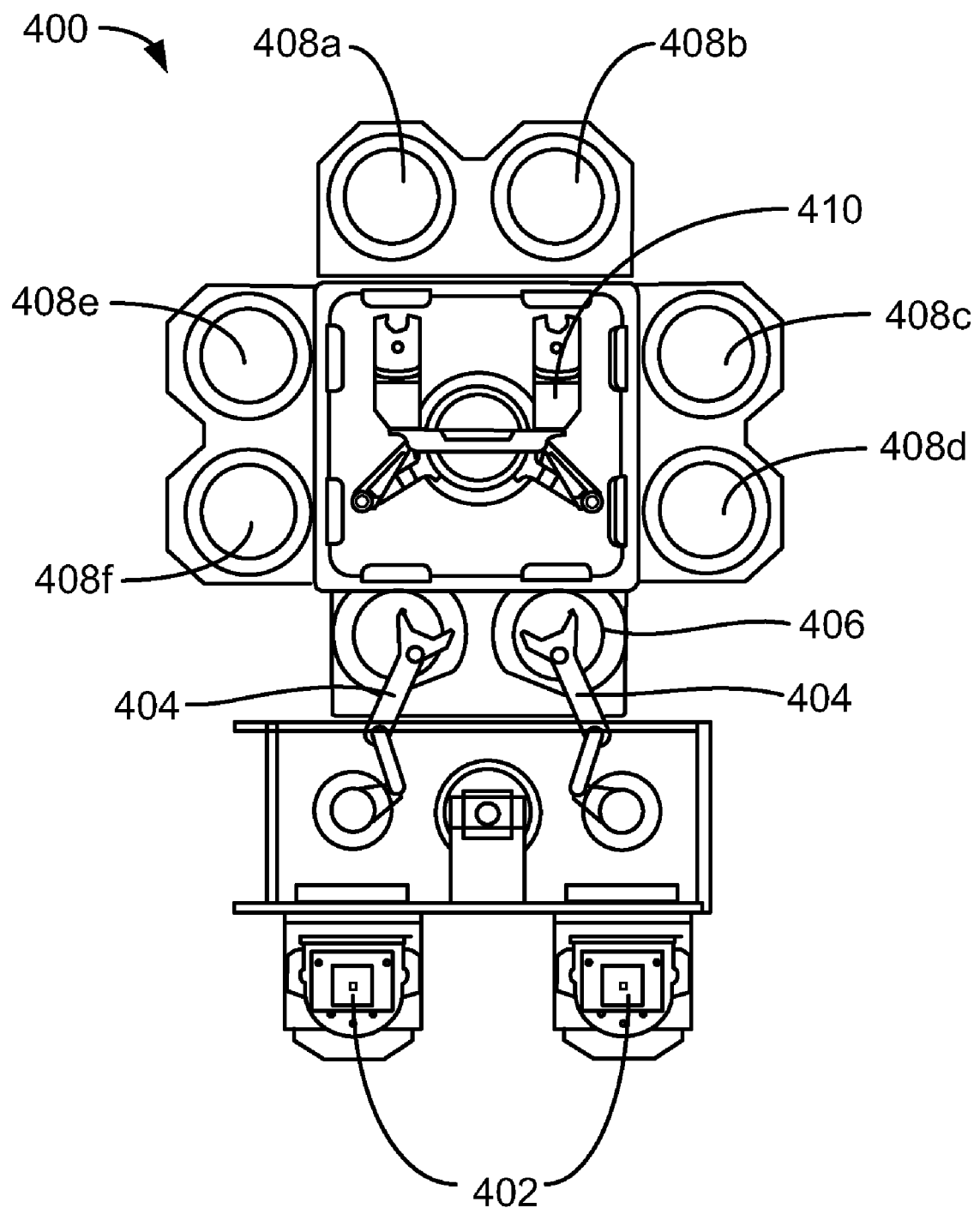
FIG. 4 shows a substrate processing system according to embodiments of the invention.

Embodiments of the deposition systems may be incorporated into larger fabrication systems for producing integrated circuit chips. FIG. 4 shows one such system 400 of deposition, baking and curing chambers according to disclosed embodiments. In the figure, a pair of FOUPs (front opening unified pods) 402 supply substrate substrates (e.g., 300 mm diameter wafers) that are received by robotic arms 404 and placed into a low pressure holding area 406 before being placed into one of the wafer processing chambers 408a-f. A second robotic arm 410 may be used to transport the substrate wafers from the holding area 406 to the processing chambers 408a-f and back.

The processing chambers 408a-f may include one or more system components for depositing, annealing, curing and/or etching a flowable dielectric film on the substrate wafer. In one configuration, two pairs of the processing chamber (e.g., 408c-d and 408e-f) may be used to deposit the flowable dielectric material on the substrate, and the third pair of processing chambers (e.g., 408a-b) may be used to anneal the deposited dielectic. In another configuration, the same two pairs of processing chambers (e.g., 408c-d and 408e-f) may be configured to both deposit and anneal a flowable dielectric film on the substrate, while the third pair of chambers (e.g., 408a-b) may be used for UV or E-beam curing of the deposited film. In still another configuration, all three pairs of chambers (e.g., 408a-f) may be configured to deposit and cure a flowable dielectric film on the substrate. In yet another configuration, two pairs of processing chambers (e.g., 408c-d and 408e-f) may be used for both deposition and UV or E-beam curing of the flowable dielectric, while a third pair of processing chambers (e.g. 408a-b) may be used for annealing the dielectric film. Any one or more of the processes described may be carried out on chamber(s) separated from the fabrication system shown in different embodiments.

In addition, one or more of the process chambers 408a-f may be configured as a wet treatment chamber. These process chambers include heating the flowable dielectric film in an atmosphere that include moisture. Thus, embodiments of system 400 may include wet treatment chambers 408a-b and anneal processing chambers 408c-d to perform both wet and dry anneals on the deposited dielectric film.

Figure 5:
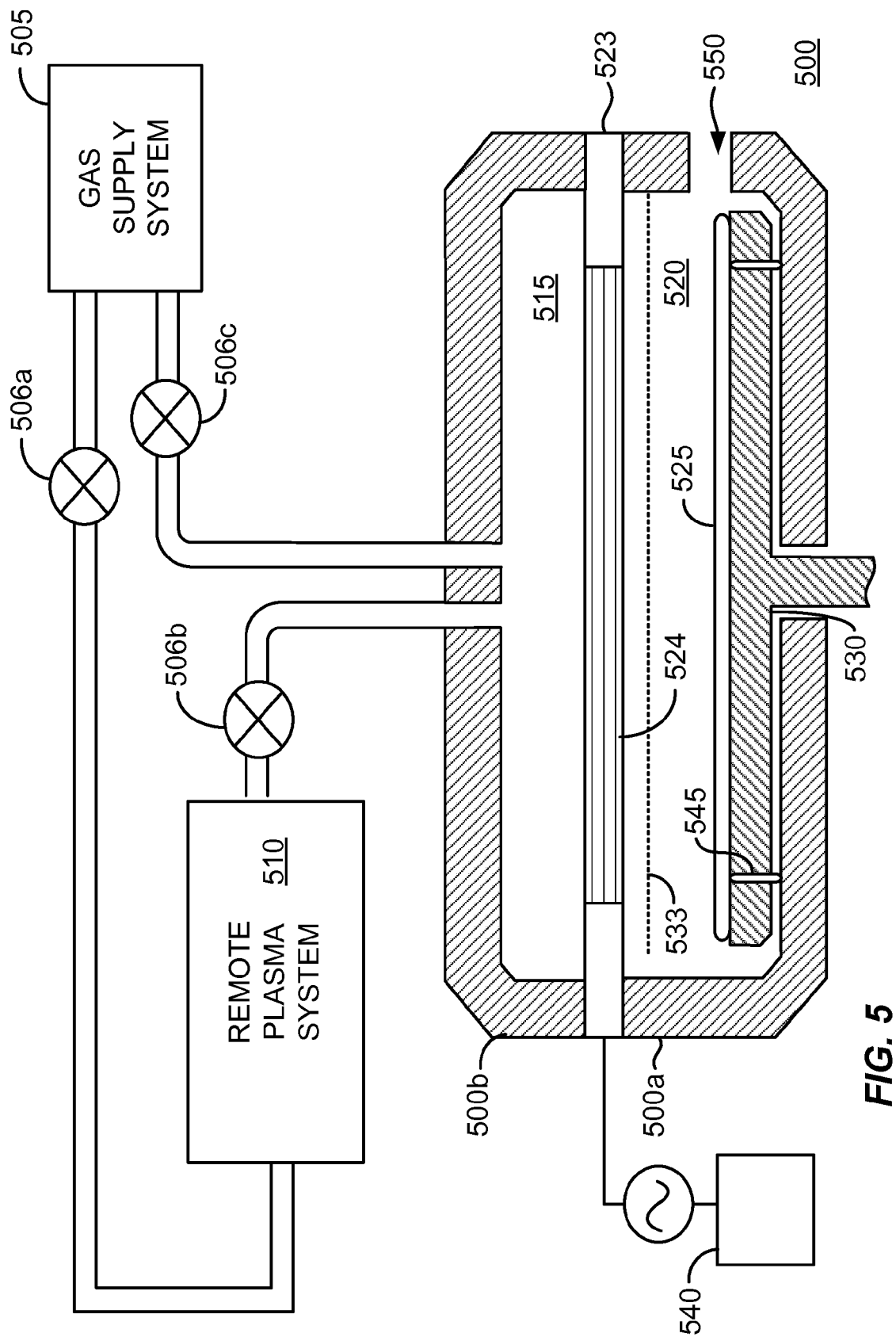
FIG. 5 shows a substrate processing chamber according to embodiments of the invention.

Referring now to FIG. 5, a vertical cross-sectional view of a PECVD chamber 500 is shown and includes a chamber body 500a and a chamber lid 500b. PECVD chamber 500 contains a gas supply system 505 which may provide several precursor through chamber lid 500b into upper chamber region 515. The precursors disperse within upper chamber region 515 and are evenly introduced into substrate processing region 520 through blocker plate assembly 523. During substrate processing, substrate processing region 520 houses substrate 525 which has been transferred onto substrate support pedestal 530. Support pedestal 530 may provide heat to substrate 525 during processing to facilitate a deposition reaction.

The bottom surface of blocker plate assembly 523 may be formed from an electrically conducting material in order to serve as an electrode for forming a capacitive plasma. During processing, the substrate (e.g. a semiconductor wafer) is positioned on a flat (or slightly convex) surface of the pedestal 530. Substrate support pedestal 530 can be moved controllably between a lower loading/off-loading position (depicted in FIG. 5) and an upper processing position (indicated by dashed line 533). The separation between the dashed line and the bottom surface of blocker plate assembly 523 is a parameter which helps control the plasma power density during processing.

Before entering upper chamber region 515, deposition and carrier gases are flowed from gas supply system 505 through combined or separated delivery lines. Generally, the supply line for each process gas includes (i) several safety shut-off valves 506 that can be used to automatically or manually shut-off the flow of process gas into the chamber, and (ii) mass flow controllers (not shown) that measure the flow of gas through the supply line. Some gases may flow through a remote plasma system (RPS) 510 prior to entry into upper chamber region 515.

Once inside upper chamber region 515, deposition and carrier gases are introduced into substrate processing region 500 through holes in perforated circular gas distribution faceplate 524 which forms the lower portion of blocker plate assembly 523. Blocker plate assembly 523 may also include a perforated blocker plate in order to increase the evenness of the distribution of precursors into substrate processing region 520.

The deposition process performed in the CVD chamber 500 can be either a thermal process or a plasma-enhanced process. In a plasma-enhanced process, an RF power supply 540 applies electrical power between gas distribution faceplate 524 and support pedestal 530 to excite the process gas mixture to form a plasma within the cylindrical region between gas distribution faceplate 524 and substrate 525 supported by pedestal 530. Gas distribution faceplate 524 has either a conducting surface or is insulating with a metal insert. Regardless of position, the metal portion of gas distribution faceplate 524 is electrically isolated from the rest of CVD chamber 500 via dielectric inserts which allow the voltage of faceplate 524 to be varied with respect to, especially, support pedestal 530.

Flowing precursors into upper chamber region 515 and subsequently into substrate processing region 520 in conjunction with applying RF power between faceplate 524 and support pedestal 530 creates a plasma between faceplate 524 and substrate 525. The plasma produces plasma effluents which react to deposit a desired film on the surface of the semiconductor wafer supported on pedestal 530. RF power supply 540 may be a mixed frequency RF power supply that typically supplies power at a high RF frequency (RF1) of 13.56 MHz and a low RF frequency (RF2) of 360 KHz to enhance the decomposition of reactive species introduced into substrate processing region 520. In a thermal process, RF power supply 540 would not be utilized, and the process gas mixture thermally reacts to deposit the desired films on the surface of the semiconductor wafer supported on support pedestal 530. Support pedestal 530 may be resistively heated to provide thermal energy to assist with the reaction.

During a plasma-enhanced deposition process, the plasma heats up process chamber 500, including the walls of the chamber body 500a surrounding an exhaust passageway (not shown) used to exhaust gases from the chamber 500. When the plasma is not turned on or during a thermal deposition process, a hot fluid may be circulated through the walls of the process chamber 500 to maintain the chamber at an elevated temperature. Channels (not shown) may be provided within the chamber walls of CVD chamber 500 for the hot fluid flow. Fluids used to heat the chamber body 500a and possibly chamber lid 500b may include water-based ethylene glycol, oil-based thermal transfer fluids and the like. Chamber heating can reduce condensation of reactant products which otherwise might migrate back into the processing chamber and adversely affect the current or a subsequent deposition.

The remainder of the gas mixture that is not deposited in a layer, including reaction byproducts, is evacuated from the CVD chamber 500 by a vacuum pump through an orifice (not shown) in chamber body 500a.

The wafer support platter of support pedestal 530 (preferably aluminum, anodized aluminum, ceramic, or a combination thereof) is resistively heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of support pedestal 500.

Typically, any or all of the chamber lining, gas inlet manifold faceplate, and various other reactor hardware are made out of material such as aluminum, anodized aluminum, or ceramic. An example of such a CVD apparatus is described in co-assigned U.S. Pat. No. 5,558,717 entitled "CVD Processing Chamber," issued to Zhao et al, and hereby incorporated by reference in its entirety.

A lift mechanism and motor raises and lowers the support pedestal 530 and its wafer lift pins 545 as wafers are transferred into and out of substrate processing region 520 by a robot blade (not shown) through an insertion/removal opening 550 in the side of chamber body 500a. The motor raises and lowers support pedestal 530 between a processing position 533 and a lower, wafer-loading position.

Remote plasma system 510 may be mounted on chamber lid 500b of CVD chamber 500. In this case, remote plasma system 510 is desirably a compact, self-contained unit that can be conveniently mounted on chamber lid 500b and be easily retrofitted onto existing chambers without costly and time-consuming modifications. One suitable unit is the ASTRON® generator available from Applied Science and Technology, Inc. of Woburn, Mass. The ASTRON® generator utilizes a low-field toroidal plasma to dissociate a process gas. In one example, the plasma dissociates a process gas including a fluorine-containing gas such as $NF_3$ and a carrier gas such as argon to generate free fluorine which is used to clean film deposits in CVD chamber 500.

The substrate processing system is controlled by a system controller. In an exemplary embodiment, the system controller includes storage media and processors (e.g. general purpose microprocessors or application specific IC's). The processors may be processor cores present on a monolithic integrated circuit, separated but still located on a single-board computer (SBC) or located on separate printed circuit cards possibly located at different locations about the substrate processing system. The processors communicate with one another as well as with analog and digital input/output boards, interface boards and stepper motor controller boards using standard communication protocols.

The system controller controls all of the activities of the CVD machine. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber and substrate temperatures, RF power levels, support pedestal position, and other parameters of a particular process.

A process for depositing a varyingly-doped film stack on a substrate can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A layer of "silicon germanium", "silicon" or "germanium" may include minority concentrations of other elemental constituents such as nitrogen, hydrogen, carbon and the like. A gas in an "excited state" describes a gas wherein at least some of the gas molecules are in vibrationally-excited, dissociated and/or ionized states. A gas may be a combination of two or more gases. The term "column" is used throughout with no implication that the formed geometry is circular. Viewed from above the surface, columns may appear circular, oval, polygonal, rectangular, or a variety of other shapes. The term "precursor" is used to refer to any process gas which takes part in a reaction to either remove or deposit material from a surface.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursor and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a high-current density vertical p-i-n diode on a substrate in a substrate processing region in a substrate processing chamber, the method comprising:
    transferring the substrate into the substrate processing region;
    flowing a group-IV-element-containing precursor having a group-IV flow rate while also flowing hydrogen with a hydrogen flow rate into the substrate processing region to form a polycrystalline semiconducting film on the substrate;
    forming an RF plasma in the substrate processing region;
    doping the semiconducting film during formation to form a vertical p-i-n film stack by sequentially
    (1) supplying a first dopant-containing precursor at a first dopant flow rate during formation of a first doped layer,
    (2) supplying essentially no flow rate of dopant-containing precursor during formation of an intrinsic layer,
    (3) supplying a second dopant-containing precursor at a second dopant flow rate during formation of a second doped layer,
    wherein formation of the first doped layer, the intrinsic layer and the second doped layer occur without exposing the substrate to atmosphere between formation of adjacent layers whereby oxygen incorporation near the interface is reduced and electronic mobility is improved, and wherein one of the first doped layer and the second doped layer is an n-type layer and the other is a p-type layer; and
    removing the substrate from the substrate processing region.

2. The method of claim 1, wherein the first dopant-containing precursor comprises a precursor selected from the group consisting of $BH_3$, $B_2H_6$, higher order boranes, halogen-substituted boranes, TEB, TMB, TEG and TMG; and the second dopant-containing precursor comprises a precursor selected from the group consisting of $PH_3$, halogen-substituted phosphines, $AsH_3$, halogen-substituted arsines, $SbH_3$, halogen-substituted stibines, TESb and TMSb.

3. The method of claim 1, wherein the second dopant-containing precursor comprises a precursor selected from the group consisting of $BH_3$, $B_2H_6$, higher order boranes, halogen-substituted boranes, TEB, TMB, TEG and TMG; and the first dopant-containing precursor comprises a precursor selected from the group consisting of $PH_3$, halogen-substituted phosphines, $AsH_3$, halogen-substituted arsines, $SbH_3$, halogen-substituted stibines, TESb and TMSb.

4. The method of claim 1, wherein the first doped layer, the intrinsic layer and the second doped layer consist essentially of silicon and germanium.

5. The method of claim 4, wherein the first doped layer, the intrinsic layer and the second doped layer consist essentially of germanium.

6. The method of claim 1, wherein the mobility of the p-i-n diode is greater than or about one of 20 $cm^2$/V-sec, 50 $cm^2$/V-sec, 100 $cm^2$/V-sec or 200 $cm^2$/V-sec.

7. The method of claim 1, further comprising the operation of patterning the first doped layer, the intrinsic layer and the second doped layer to form a columnar p-i-n structure having a column width.

8. The method of claim 7, wherein the column width is less than or about 30 nm.

9. The method of claim 8, wherein the columnar p-i-n structure can tolerate 1 μAmp of current.

10. The method of claim 1, wherein the first doped layer is n-type and the second doped layer is p-type.

11. The method of claim 1, wherein the first doped layer is p-type and the second doped layer is n-type.

12. The method of claim 1, wherein the n-type layer comprises a dopant selected from the group consisting of phosphorus (P), arsenic (As) and antimony (Sb).

13. The method of claim 1, wherein the p-type layer comprises a dopant selected from the group consisting of boron (B) and gallium (Sb).

14. The method of claim 1, wherein the operation of supplying essentially no flow rate of dopant-containing precursor results in the intrinsic layer having a dopant density less than or about one of $10^{16}/cm^3$, $10^{17}/cm^3$ or $10^{18}/cm^3$.

15. The method of claim 1, wherein the group-IV-element-containing precursor comprises a precursor selected from the group consisting of $GeH_4$, $Ge_2H_6$, higher order germanes and halogen-substituted germanes.

16. The method of claim 1, wherein the group-IV-element-containing precursor comprises a precursor selected from the group consisting of $SiH_4$, $Si_2H_6$, higher order silanes and halogen-substituted silanes.

17. The method of claim 1, further comprising the operation of flowing helium with a helium flow rate during formation of the p-i-n diode.

18. The method of claim 1, wherein the flow of the group-IV-element-containing precursor is interrupted between the first doped layer and the intrinsic layer or between the intrinsic layer and the second doped layer, but the vacuum is not broken so the substrate is not exposed to the atmosphere.

* * * * *